United States Patent
Huang et al.

(10) Patent No.: US 12,283,345 B2
(45) Date of Patent: Apr. 22, 2025

(54) PULSE GENERATOR, ERROR CHECK AND SCRUB (ECS) CIRCUIT AND MEMORY

(71) Applicant: CHANGXIN MEMORY TECHNOLOGIES, INC., Hefei (CN)

(72) Inventors: Zequn Huang, Hefei (CN); Kai Sun, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 220 days.

(21) Appl. No.: 18/166,034

(22) Filed: Feb. 8, 2023

(65) Prior Publication Data

US 2024/0038282 A1    Feb. 1, 2024

Related U.S. Application Data

(63) Continuation of application No. PCT/CN2022/112053, filed on Aug. 12, 2022.

(30) Foreign Application Priority Data

Jul. 28, 2022    (CN) .......................... 202210901663.5

(51) Int. Cl.
*G11C 7/10*    (2006.01)
*G11C 29/52*    (2006.01)

(52) U.S. Cl.
CPC .......... *G11C 7/1093* (2013.01); *G11C 7/1087* (2013.01); *G11C 29/52* (2013.01)

(58) Field of Classification Search
CPC ................................ G11C 7/1093; G11C 7/10
(Continued)

(56) References Cited

U.S. PATENT DOCUMENTS

| 2010/0110800 A1 | 5/2010 | Lee |
| 2011/0109362 A1* | 5/2011 | Kim ..................... G11C 7/1048 |
| | | 327/172 |

(Continued)

FOREIGN PATENT DOCUMENTS

| CN | 101740104 A | 6/2010 |
| CN | 103580676 A | 2/2014 |

(Continued)

OTHER PUBLICATIONS

DDR5 SDRAM, JEDEC JESD 79-5, JEDEC Solid State Technology Association, Jul. 2020, p. 244-249.*

(Continued)

*Primary Examiner* — Muna A Techane
(74) *Attorney, Agent, or Firm* — Syncoda LLC; Feng Ma (57) ABSTRACT

A pulse generator, an Error Check and Scrub (ECS) circuit and a memory are provided. The pulse generator includes: a delay circuit configured to receive an ECS command signal, perform delay processing on the ECS command signal, and output a delay command signal, the delay between the ECS command signal and the delay command signal being a first preset value; and a latch circuit configured to receive the ECS command signal and the delay command signal, perform latch processing based on the ECS command signal and the delay command signal, and output an ECS pulse signal. The pulse width of the ECS command signal is provided with a plurality of values, and the pulse width of the ECS pulse signal is the first preset value.

14 Claims, 8 Drawing Sheets

(58) Field of Classification Search
USPC .................................................. 365/233.1
See application file for complete search history.

(56) References Cited

U.S. PATENT DOCUMENTS

| | | | |
|---|---|---|---|
| 2012/0026803 A1 | 2/2012 | Lee | |
| 2013/0141148 A1* | 6/2013 | Ishii | H03K 3/017 |
| | | | 327/174 |
| 2013/0141989 A1 | 6/2013 | Jeong | |
| 2014/0043926 A1 | 2/2014 | Kim | |
| 2018/0267852 A1* | 9/2018 | Kwon | G11C 16/32 |
| 2018/0307559 A1 | 10/2018 | Lee et al. | |
| 2019/0122744 A1* | 4/2019 | Alzheimer | G11C 29/14 |
| 2019/0161341 A1* | 5/2019 | Howe | B81C 1/00301 |
| 2020/0201705 A1 | 6/2020 | Kim et al. | |
| 2021/0141687 A1* | 5/2021 | Song | G06F 3/0659 |
| 2021/0142860 A1 | 5/2021 | Song et al. | |
| 2021/0391874 A1 | 12/2021 | Choi | |
| 2022/0148645 A1 | 5/2022 | Meier et al. | |
| 2022/0188183 A1 | 6/2022 | Kim et al. | |
| 2022/0375509 A1* | 11/2022 | Meier | G06F 3/0673 |

FOREIGN PATENT DOCUMENTS

| | | |
|---|---|---|
| CN | 111354390 A | 6/2020 |
| CN | 112783686 A | 5/2021 |
| CN | 113778741 A | 12/2021 |
| KR | 20080003027 A | 1/2008 |

OTHER PUBLICATIONS

Extended European Search Report in application No. 22924579, mailed on Sep. 19, 2024.

* cited by examiner

PULSE GENERATOR, ERROR CHECK AND SCRUB (ECS) CIRCUIT AND MEMORY

CROSS-REFERENCE TO RELATED APPLICATION

This is a continuation of International Patent Application No. PCT/CN2022/112053, filed on Aug. 12, 2022, which claims priority to Chinese Patent Application No. 202210901663.5, filed on Jul. 28, 2022. The disclosures of International Patent Application No. PCT/CN2022/112053 and Chinese Patent Application No. 202210901663.5 are hereby incorporated by reference in their entireties.

BACKGROUND

There is an Error Check and Scrub (ECS) mode in a Dynamic Random Access Memory (DRAM). The ECS mode allows the DRAM to read and modify a detected error codeword and record the error count. In the ECS mode, an ECS command signal may be generated by a multi-purpose command MPC, a self-refresh instruction Self_Refresh or a refresh instruction Refresh, and then a stable ECS pulse signal is generated by the ECS command signal to complete internal activation, read/write and precharge operation commands. At present, in different working scenarios, the pulse width of the ECS command signal varies greatly, which leads to the instability of the pulse width of the ECS pulse signal, and an error may occur in the ECS mode, thus affecting the performance of the memory.

SUMMARY

The disclosure relates to the technical field of semiconductor memories, and provides a pulse generator, an ECS circuit and a memory. The pulse generator can generate an ECS pulse signal with a stable pulse width to avoid errors in an ECS mode.

The technical solutions of the disclosure are implemented as follows.

According to a first aspect, embodiments of the disclosure provide a pulse generator. The pulse generator may include a delay circuit and a latch circuit. The delay circuit is configured to receive an ECS command signal, perform delay processing on the ECS command signal, and output a delay command signal. The delay between the ECS command signal and the delay command signal is a first preset value. The latch circuit is configured to receive the ECS command signal and the delay command signal, perform latch processing based on the ECS command signal and the delay command signal, and output an ECS pulse signal. The pulse width of the ECS command signal is provided with a plurality of values, and the pulse width of the ECS pulse signal is the first preset value.

According to a second aspect, the embodiments of the disclosure provide an ECS circuit. The ECS circuit includes a command generation circuit and the pulse generator as described in the first aspect. The command generation circuit is configured to receive an external multi-purpose command in a first operating mode, and output an ECS command signal based on the multi-purpose command. The pulse width of the ECS command signal is associated with the pulse width of the multi-purpose command, and the pulse width of the multi-purpose command is provided with a plurality of values. The pulse generator is configured to output an ECS pulse signal based on the ECS command signal. The pulse width of the ECS pulse signal is a first preset value.

According to a third aspect, the embodiments of the disclosure provide a memory. The memory at least includes an ECS circuit as described in the second aspect.

The embodiments of the disclosure provide a pulse generator, an ECS circuit and a memory. The pulse generator includes a delay circuit and a latch circuit. The delay circuit is configured to receive an ECS command signal, perform delay processing on the ECS command signal, and output a delay command signal. The delay between the ECS command signal and the delay command signal is a first preset value. The latch circuit is configured to receive the ECS command signal and the delay command signal, perform latch processing based on the ECS command signal and the delay command signal, and output an ECS pulse signal. The pulse width of the ECS command signal has a plurality of values, and the pulse width of the ECS pulse signal is the first preset value. Thus, the pulse width of the ECS pulse signal depends on the delay value between the ECS command signal and the delay command signal. That is, the pulse width of the ECS pulse signal is only determined by delay processing on the ECS command signal by the delay circuit, and is not affected by the pulse width of the ECS command signal. Therefore, the pulse generator can generate the ECS pulse signal with a stable pulse width, avoid errors in the ECS mode, and finally improve the performance of the memory.

DETAILED DESCRIPTION

Technical solutions in the embodiments of the disclosure are clearly and completely described below in combination with the drawings in the embodiments of the disclosure. It can be understood that the specific embodiments described herein are merely illustrative of the disclosure and are not intended to limit the disclosure. In addition, it is also to be noted that, for ease of description, only the parts related to the relevant disclosure are shown in the drawings. Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure. "Some embodiments" involved in the following descriptions describes a subset of all possible embodiments. However, it can be understood that "some embodiments" may be the same subset or different subsets of all the possible embodiments, and may be combined without conflicts. It is to be pointed out that terms "first/second/third" involved in the embodiments of the disclosure are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

Dynamic Random Access Memory (DRAM)
Synchronous DRAM (SDRAM)
Double Data Rate SDRAM (DDR)
DDR5 Specification (DDR5 SPEC)

Figure 1:
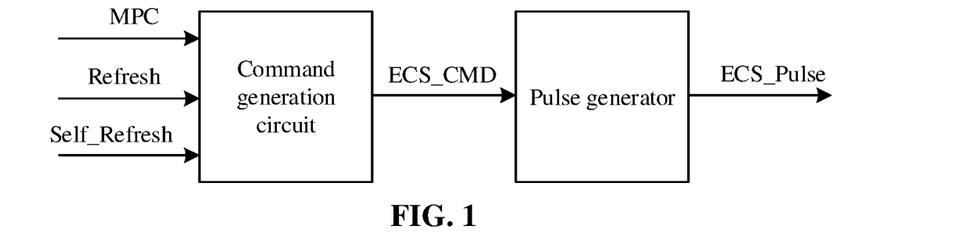
FIG. 1 is a schematic structural diagram of an ECS circuit.

Taking DDR5 DRAM as an example, an ECS mode may be divided into an automatic ECS operation mode and a manual ECS operation mode. In the manual ECS operation mode, an ECS command signal is generated by a multi-purpose command MPC sent by a memory Controller. In the automatic ECS operation mode, the ECS command signal is generated by a refresh instruction or a self-refresh instruction. After the ECS command signal, activation, read/write, and precharge operations are required. Referring to FIG. 1, which illustrates a schematic structural diagram of an ECS circuit. As shown in FIG. 1, the ECS circuit at least includes a command generation circuit and a pulse generator. As shown in FIG. 1, in the manual ECS operation mode, the command generation circuit receives the multi-purpose command MPC from the memory Controller, and a specific multi-purpose command MPC may generate the ECS command signal ECS_CMD. However, in the automatic ECS operation mode, there is no multi-purpose command MPC in such case, so the command generation circuit steals the refresh instruction Refresh or the self-refresh instruction Self-Refresh to generate the ECS command signal ECS_CMD. Then, the pulse generator uses the ECS command signal ECS_CMD to generate a stable ECS pulse signal ECS_Pulse, and the ECS pulse signal ECS_Pulse is used for internal activation, read/write and precharge operations.

Figure 2:
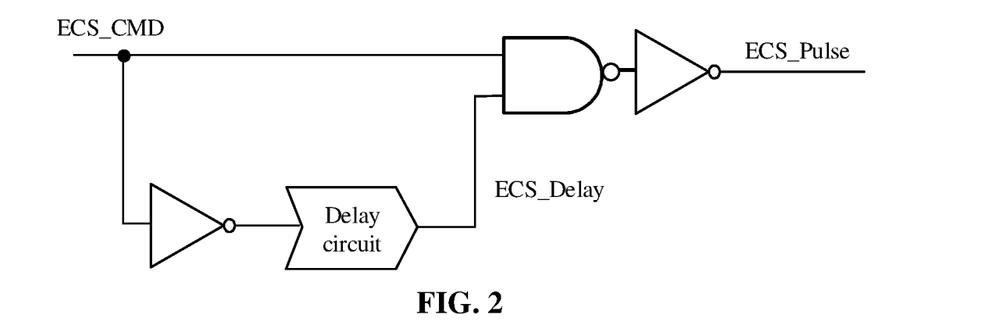
FIG. 2 is a schematic structural diagram of a pulse generator.

For the memory, the required ECS pulse signal ECS_Pulse has a pulse width of about 2 ns. Referring to FIG. 2, which illustrates a schematic structural diagram of a pulse generator. As shown in FIG. 2, the pulse generator includes two inverters, a NAND gate and a delay circuit, and the delay circuit fixedly generates a delay of 2 nanosecond (ns). That is, an inverted signal of the delay command signal ECS_Delay is delayed by 2 ns to generate the delay command signal ECS_Delay, and the delay command signal ECS_Delay and the delay command signal ECS_Delay are AND-operated to generate the ECS pulse signal ECS_Pulse. In the automatic ECS operation mode, the pulse width of the stolen self-refresh instruction Self_Refresh is about 2.5 ns, and the pulse width of the ECS command signal ECS_CMD generated by the pulse meets the requirements. In the manual ECS operation mode, when the ECS command signal ECS_CMD is generated by the multi-purpose command MPC, the pulse width of the multi-purpose command MPC sent by the external Controller may be one clock cycle (tCK) or a plurality of tCK. That is, for the pulse generator shown in FIG. 2, when in the manual ECS operation mode, if the external working frequency is large and the multi-purpose command MPC only includes one tCK, the pulse width of the generated ECS command signal ECS_CMD is small, and a required ECS pulse signal ECS_Pulse cannot be generated in such case.

Figure 3:
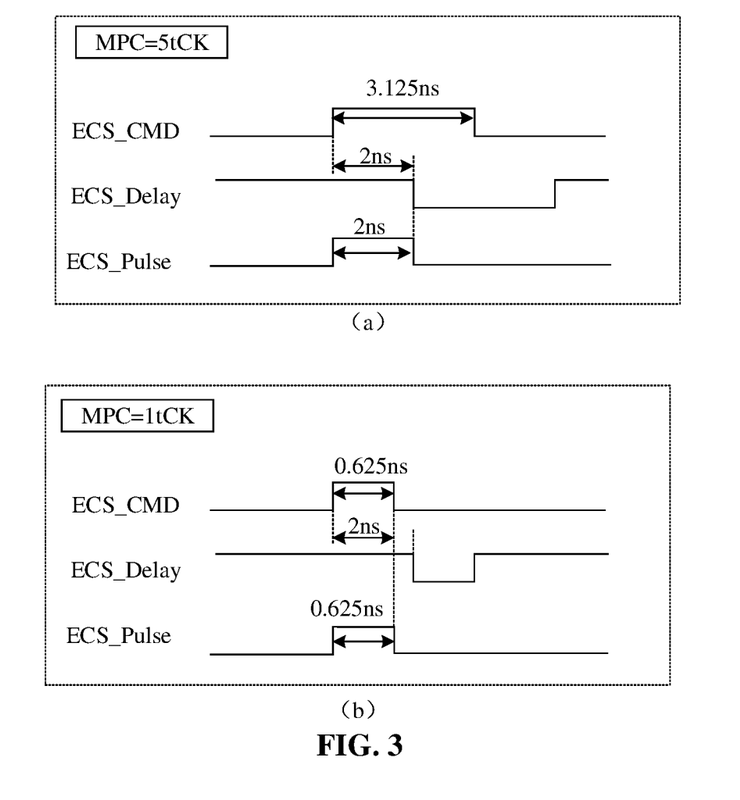
FIG. 3 is a schematic diagram of signal timing.

Taking the working frequency being 3200 million bits per second (Mbps) and the pulse width of the multi-purpose command MPC being 1 tCK and 5 tCK as an example, explanation is made to the change of the ECS pulse signal ECS_Pulse. Referring to FIG. 3, which illustrates a schematic diagram of signal timing. As shown in (a) of FIG. 3, in the case where the pulse width of the multi-purpose command MPC is 5 tCK, the pulse width of the ECS command signal ECS_CMD is about 3.125 ns, and the delay between the delay command signal ECS_Delay and the ECS command signal ECS_CMD is 2 ns. A falling edge of the ECS pulse signal ECS_Pulse is caused by the falling edge of the delay command signal ECS_Delay, so the pulse width of the ECS pulse signal ECS_Pulse is also 2 ns. As shown in (b) of FIG. 3, in the case where the pulse width of the multi-purpose command MPC is 1 tCK, the pulse width of the ECS command signal ECS_CMD is about 0.625 ns, and the delay between the delay command signal ECS_Delay and the ECS command signal ECS_CMD is 2 ns. The falling edge of the ECS pulse signal ECS_Pulse is caused by the falling edge of the ECS command signal ECS_CMD, so the pulse width of the ECS pulse signal ECS_Pulse is 0.625 ns, which cannot meet the demand.

In short, in the manual ECS operation mode, it is necessary to generate the ECS command through the multi-purpose command MPC, and then generate the ECS pulse signal ECS_Pulse. Since the pulse width of the multi-purpose command MPC may be one tCK or a plurality of tCK, when the pulse generator shown in FIG. 2 is used to generate the ECS pulse signal ECS_Pulse, the pulse width of the corresponding ECS command signal may also change if the external working frequency changes. If the external working frequency is large, the ECS pulse signal ECS_Pulse that meets the requirements cannot be generated. Therefore, a stable automatic pulse generator is needed to generate an ECS pulse signal ECS_Pulse with a pulse width of about 2 ns to solve problems encountered in the ECS mode.

Based thereon, the embodiments of the disclosure provide a pulse generator. The pulse generator includes a delay circuit and a latch circuit. The delay circuit is configured to receive an ECS command signal, perform delay processing on the ECS command signal, and output a delay command signal. The delay between the ECS command signal and the delay command signal is a first preset value. The latch circuit is configured to receive the ECS command signal and the delay command signal, perform latch processing based on the ECS command signal and the delay command signal, and output an ECS pulse signal. The pulse width of the ECS command signal has a plurality of values, and the pulse width of the ECS pulse signal is the first preset value. Thus, the pulse width of the ECS pulse signal depends on the delay value between the ECS command signal and the delay command signal. That is, the pulse width of the ECS pulse signal is only determined by delay processing on the ECS command signal by the delay circuit, and is not affected by the pulse width of the ECS command signal. Therefore, the pulse generator can generate the ECS pulse signal with a stable pulse width, avoid errors in the ECS mode, and finally improve the performance of the memory.

Various embodiments of the present disclosure will now be described in detail in combination with the accompanying drawings.

Figure 4:
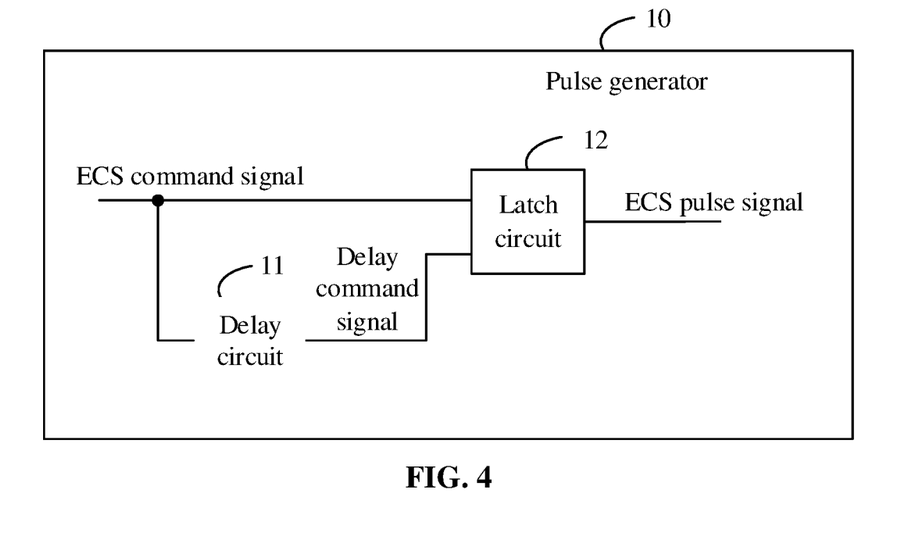
FIG. 4 is a schematic structural diagram of a pulse generator according to an embodiment of the disclosure.

In an embodiment of the disclosure, referring to FIG. 4, FIG. 4 illustrates a schematic structural diagram of a pulse generator 10 according to an embodiment of the disclosure. As shown in FIG. 4, the pulse generator 10 includes: a delay circuit 11 and a latch circuit 12.

The delay circuit 11 is configured to receive an ECS command signal, perform delay processing on the ECS command signal, and output a delay command signal. Herein, the delay between the ECS command signal and the delay command signal is a first preset value.

The latch circuit 12 is configured to receive the ECS command signal and the delay command signal, perform latch processing based on the ECS command signal and the delay command signal, and output an ECS pulse signal.

Herein, the pulse width of the ECS command signal is provided with a plurality of values, and the pulse width of the ECS pulse signal is the first preset value.

It is to be noted that the pulse generator 10 of the embodiment of the disclosure may be applied to, but not limited to, a memory, such as DRAM, SDRAM and DDR. In addition, in other analog circuits/digital circuits, the pulse generator 10 provided by the embodiment of the disclosure may be used to generate a signal with a stable pulse width.

It is to be noted that in the pulse generator 10, the delay processing on the ECS command signal by the delay circuit 11 is preset, so the delay value between the ECS command signal and the delay command signal is stabilized at the first preset value. Furthermore, since the pulse width of ECS pulse signal only depends on the delay value between the ECS command signal and the delay command signal, without being affected by the pulse width of the ECS command signal, the pulse width of the ECS pulse signal is also stabilized at the first preset value. Thus, the pulse generator 10 can generate an ECS pulse signal with a stable pulse width, without being affected by the external working frequency, thereby ensuring that the waveform of the ECS pulse signal always meets the requirements, and further ensuring the smooth execution of subsequent operations such as activation, read/write and precharge, and avoiding errors in the ECS mode.

It is to be understood that the embodiment of the disclosure allows a certain error for the delay value, pulse width and other related values. That is, the delay between the ECS command signal and the delay command signal is the first preset value within an allowable error range.

In some embodiments, initial values of the ECS command signal and the ECS pulse signal are both first level values. The latch circuit 12 is specifically configured to control the ECS pulse signal to change from the first level value to a second level value when the ECS command signal changes from the first level value to the second level value, and control the ECS pulse signal to change from the second level value to the first level value when the delay command signal changes from the first level value to the second level value.

It is to be noted that the first level value and the second level value are different, and specific values thereof may be determined according to actual application scenarios. Exemplarily, the first level value is represented as 0, and the second level value is represented as 1. In such case, a rising edge of the ECS pulse signal is generated by a rising edge of the ECS command signal, and a falling edge of the ECS pulse signal is generated by the rising edge of delay command signal, so "pulse width of the ECS pulse signal" is the same as "delay between the ECS command signal and the delay command signal", both of which are the first preset value.

As mentioned above, since the ECS command signal is generated according to the multi-purpose command, the refresh instruction or the self-refresh instruction, and there are many possibilities for the pulse width of the multi-purpose command, the pulse width of the ECS command signal has a plurality of values. However, due to the structure of the pulse generator 10, the pulse width of the ECS pulse signal is always fixed to the first preset value.

Specifically, in the manual ECS operation mode, the pulse width of the ECS command signal depends on the pulse width of the multi-purpose command MPC. In the automatic ECS operation mode, the pulse width of the ECS command signal depends on the pulse width of the refresh instruction Refresh or the self-refresh instruction Self_Refresh. For the manual ECS operation mode, the multi-purpose command MPC is sent by the memory controller, the pulse width thereof may be multiple possible values such as 1 tCK or 5 tCK, and the size of tCK depends on the external working frequency.

Figure 5:
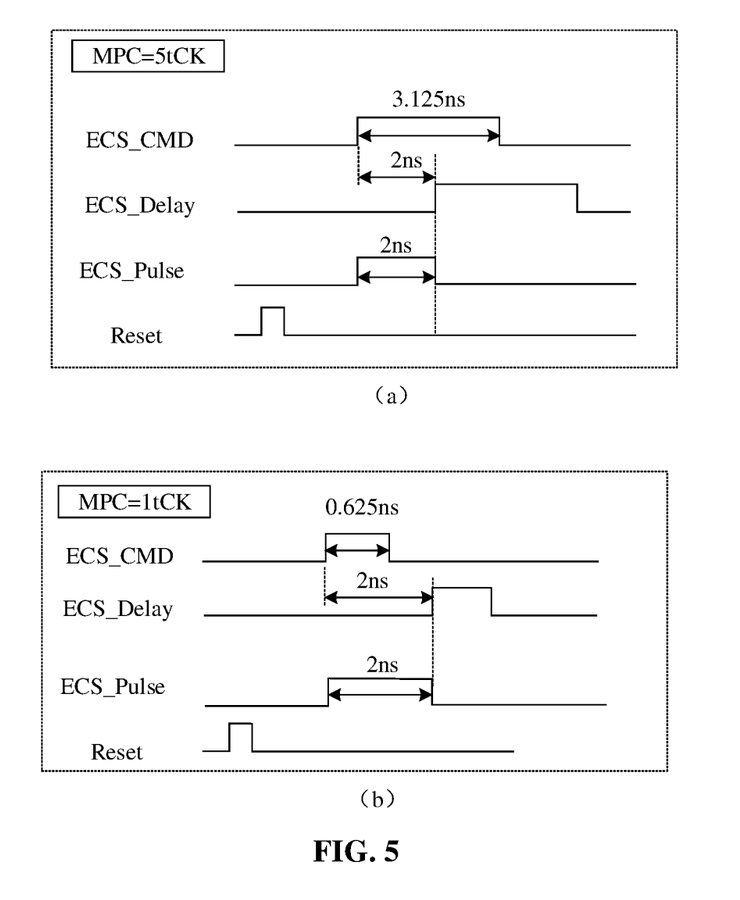
FIG. 5 is a schematic diagram of signal timing according to an embodiment of the disclosure.

Taking the external working frequency being 3200 Mbps as an example, in such case, 1 tCK=0.625 ns, and 5 tCK=3.125 ns, assuming that the delay circuit 11 can fixedly generate a delay of 2 ns (that is, the first preset value=2 ns), referring to FIG. 5, FIG. 5 illustrates a schematic diagram of signal timing according to an embodiment of the disclosure. As shown in (a) of FIG. 5, in the case where the pulse width of the multi-purpose command MPC is 5 tCK, the pulse width of the ECS command signal ECS_CMD is 3.125 ns, and since the delay between the ECS command signal ECS_CMD and the delay command signal ECS_Delay is 2 ns, the pulse width of the ECS pulse signal ECS_Pulse is 2 ns. As shown in (b) of FIG. 5, in the case where the pulse width of the multi-purpose command MPC is 1 tCK, the pulse width of the ECS command signal ECS_CMD is 0.625 ns, and since the delay between the ECS command signal ECS_CMD and the delay command signal ECS_Delay is 2 ns, the pulse width of the ECS pulse signal ECS_Pulse is 2 ns as well.

Thus, in the manual ECS operation, no matter how many tCK the pulse width of the multi-purpose command MPC is, and no matter which range the external working frequency is in, the ECS pulse signal with a stable pulse width may be generated for normal execution of the subsequent operations.

In some embodiments, the latch circuit 12 is further configured to receive a reset signal, and control an initial state of the ECS pulse signal to be the first level value based on the reset signal. Thus, through the reset signal, the initial state of the ECS pulse signal may be kept at the first level value to implement the aforementioned control logic.

A specific configuration of the latch circuit 12 is provided below.

Figure 6:
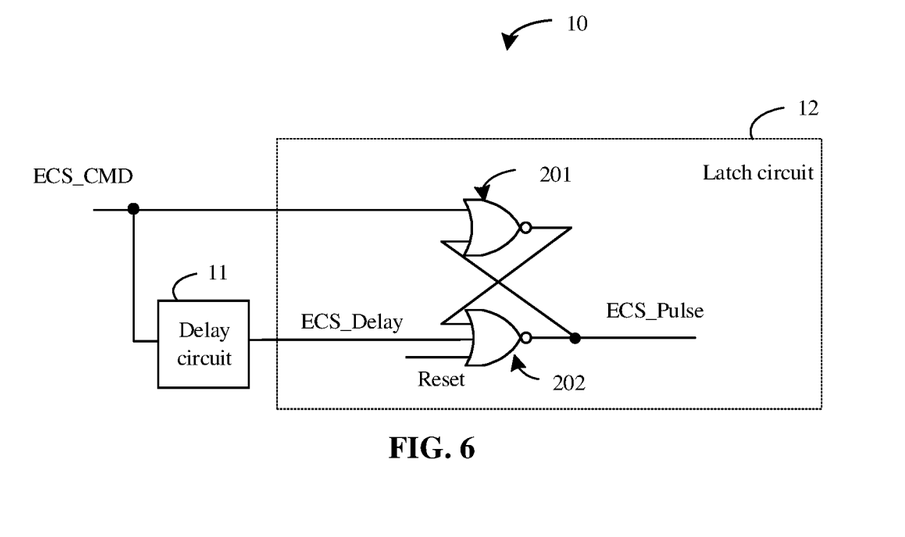
FIG. 6 is a first schematic structural diagram of a latch circuit according to an embodiment of the disclosure.

In some embodiments, as shown in FIG. 6, the latch circuit 12 includes a first NOR gate 201 and a second NOR gate 202. Herein, a first input end of the first NOR gate 201 receives the ECS command signal ECS_CMD, and a second input end of the first NOR gate 201 is connected to an output end of the second NOR gate 202. A first input end of the second NOR gate 202 is connected to an output end of the first NOR gate 201, a second input end of the second NOR gate 202 receives the delay command signal ECS_Delay, and a third input end of the second NOR gate 202 receives the reset signal Reset. Correspondingly, the output end of the second NOR gate 202 is configured to output the ECS pulse signal ECS_Pulse.

It is to be noted that the first NOR gate 201 and the second NOR gate 202 form a Set-Reset (SR) Latch. The ECS command signal ECS_CMD is connected to a SET end of the SR latch, and then the delay command signal ECS_Delay (equivalent to the ECS command signal delayed by 2 ns) is connected to a RESET end of the SR latch. In addition, the external reset signal Reset may be used as an initial value. That is, when there is no ECS command signal ECSvCMD, the ECS pulse signal ECS_Pulse is controlled to be 0.

With reference to FIGS. 5 and 6, for the SET end of the SR latch, when the ECS command signal ECS_CMD changes from 0 to 1 (rising edge), the ECS pulse signal ECS_Pulse changes from 0 to 1 (rising edge). Then, for the RESET end of the SR latch, when the delay command signal ECS_Delay changes from 0 to 1 (rising edge), the ECS pulse signal ECS_Pulse changes from 1 to 0 (falling edge), ensuring that the pulse width of the ECS pulse signal ECS_Pulse is about 2 ns.

It is to be noted that the ECS pulse signal ECS_Pulse, as the output of the second NOR gate 202, must be connected to the input end of the first NOR gate 201, so that the delay command signal ECS_Delay and the reset signal Reset have higher priority in the SR latch. Thus, when the pulse width of the ECS command signal ECS_CMD is greater than 2 ns, both the ECS command signal ECS_CMD and the delay command signal ECS_Delay are 1, but the delay command signal ECS_Delay can still reset the ECS pulse signal ECS_Pulse, thus ensuring that the pulse width of the ECS pulse signal ECS_Pulse is the first preset value.

Figure 7:
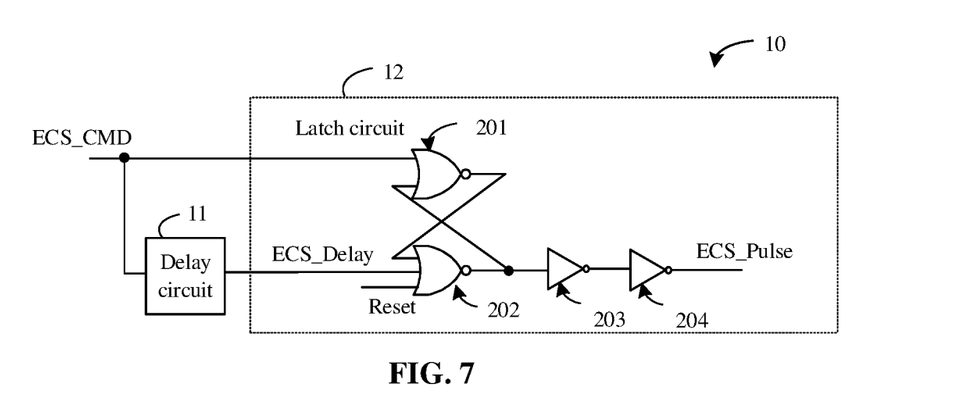
FIG. 7 is a second schematic structural diagram of a latch circuit according to an embodiment of the disclosure.

Based on FIG. 6, as shown in FIG. 7, in other embodiments, the latch circuit 12 further includes a first inverter 203 and a second inverter 204. An input end of the first inverter 203 is connected to the output end of the second NOR gate 202, and an input end of the second inverter 204 is connected to an output end of the first inverter 203. Correspondingly, an output end of the second inverter 204 is configured to output the ECS pulse signal.

It is to be noted that delay matching and drive enhancement are performed on the ECS pulse signal by the two inverters, so that the ECS pulse signal is more stable and meets the timing requirements.

Thus, compared with the pulse generator in FIG. 2, the pulse generator 10 in FIG. 7 can ensure that the pulse width of the ECS pulse signal is 2 ns in both the automatic ECS operation mode and the manual ECS operation mode, so that the ECS pulse signal is not affected by external frequency in the manual ECS operation mode, and the ECS pulse signal with a stable pulse width can be generated no matter how many tCK the pulse period of the multi-purpose command MPC is.

In addition, the embodiments of the disclosure also improve the delay circuit, so that the delay of the delay circuit 11 is stabilized at the first preset value in different scenarios, and the delay of the delay circuit 11 is adjustable (that is, the first preset value is adjustable).

Figure 8:
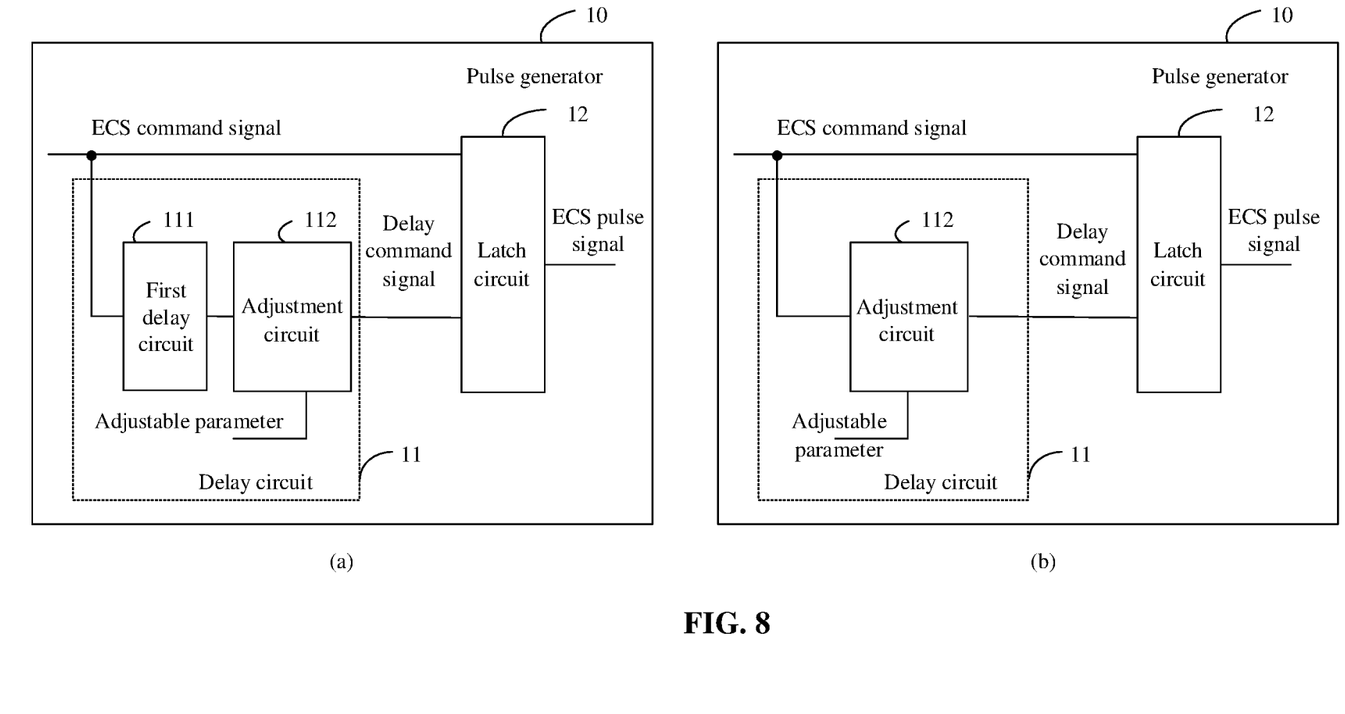
FIG. 8 is a schematic structural diagram of another pulse generator according to an embodiment of the disclosure.

In a feasible embodiment, as shown in (a) of FIG. 8, the delay circuit 11 includes a first delay circuit 111 and an adjustment circuit 112.

The first delay circuit 111 is configured to receive the ECS command signal and output an intermediate delay signal. Herein, a delay value between the ECS command signal and the intermediate delay signal is smaller than the first preset value.

The adjustment circuit 112 is configured to receive an adjustable parameter, perform delay processing on the intermediate delay signal based on the adjustable parameter, and output the delay command signal.

It is to be understood that the first delay circuit 111 and the adjustment circuit 112 are connected in series, and the positions thereof may be exchanged. Thus, the first delay circuit 111 can perform fixed delay on the ECS command signal, and the adjustment circuit 112 may adjust the ECS command signal to different degrees according to the adjustable parameter, thus ensuring that the delay between the ECS command signal and the delay command signal is the first preset value.

Exemplarily, assuming that the first preset value is 2 ns, the first delay circuit 111 can delay the intermediate delay signal by 1.8 ns with respect to the ECS command signal under a standard environmental parameter, while the adjustment circuit 112 can delay the delay command signal by 0.2 ns with respect to the intermediate delay signal when adjusting the initial value of the parameter, so as to jointly implement that the delay between the ECS command signal and the delay command signal is 2 ns.

In one case, the delay value of the first delay circuit 111 shifts due to the change of a working environment parameter, so that the intermediate delay signal is delayed by 1.7 ns with respect to the ECS command signal. Then, the value of the adjustable parameter is adjusted, so that the delay command signal is delayed by 0.3 ns with respect to the intermediate delay signal, and consequently the delay between the ECS command signal and the delay command signal is still 2 ns. The delay offset caused by other factors may be understood accordingly.

In another case, if the first preset value is expected to be adjusted from 2 ns to 2.5 ns, the value of the adjustable parameter is adjusted, so that the delay command signal is delayed by 0.7 ns with respect to the intermediate delay signal, and consequently the delay between the ECS command signal and the delay command signal is adjusted to 2.5 ns.

Thus, the functions of the delay circuit 11 provided by the embodiments of the disclosure are richer and more stable, and the performance of the pulse generator 10 is also improved.

In another feasible embodiment, as shown in (b) of FIG. 8, the delay circuit 11 includes an adjustment circuit 112. The adjustment circuit 112 is configured to receive an adjustable parameter, perform delay processing on the ECS command signal based on the adjustable parameter, and output the delay command signal.

That is, the delay circuit 11 merely includes the adjustment circuit, without a unit for fixed delay. Thus, the adjustment range of the first preset value is more flexible, but the control logic correspondingly becomes more, which may be applicable to scenarios with specific requirements.

Detailed description is made below to the adjustment principle of the adjustment circuit 112. Particularly, the description below may all be applied to a circuit structure shown in (a) of FIG. 8 or a circuit structure shown in (b) of FIG. 8.

Figure 9:
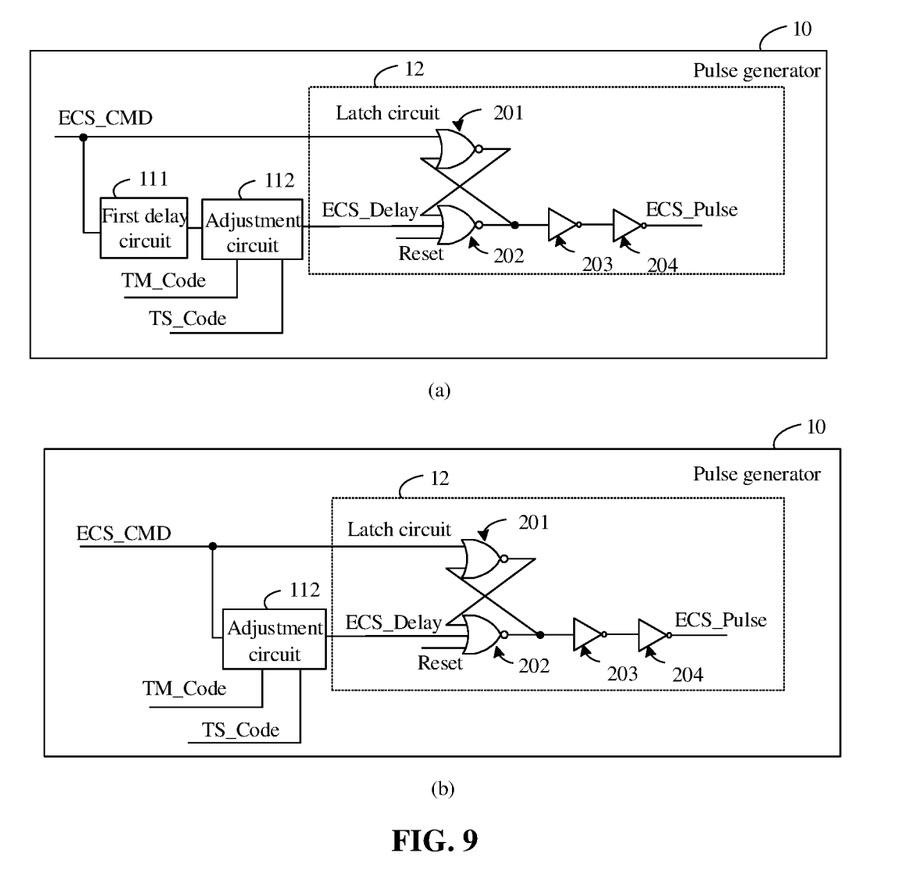
FIG. 9 is a schematic structural diagram of another pulse generator according to an embodiment of the disclosure.

In some embodiments, as shown in (a) or (b) of FIG. 9, the pulse generator 10 is applied to a memory, and the adjustable parameter includes N adjustment sub-signals, N being a positive integer. The N adjustment sub-signals are set via an external command in a test mode of the memory, which may be called a test mode code TM_Code. Or, the N adjustment sub-signals are determined based on temperature decoding of the memory, which may be called a temperature sensor code TS_Code. Or, part of the N adjustment sub-signals is set via the external command in the test mode of the memory, while the rest of the N adjustment sub-signals is determined based on temperature decoding of the memory. That is, the N adjustment sub-signals are constituted jointly by the test mode code TM_Code and the temperature sensor code TS_Code.

Thus, when the memory is in the test mode, a user may send a setting command to set the specific value of the test mode code TM_Code, so as to change the delay generated by the adjustment circuit 112, and compensate the process deviation of the delay circuit 11 in the manufacturing process or the deviation caused by other factors (or modify the first preset value). And/or, in the working process of the memory, the temperature sensor code TS_Code is obtained based on the working temperature decoding so as to change the delay generated by the adjustment circuit 112. That is, the memory may automatically adjust the delay value generated by the delay circuit 11 according to the temperature condition, so as to compensate the delay deviation of the delay circuit 11 caused by the change of the working temperature (or the first preset value may also be modified by modifying a decoding rule). Thus, the delay value of the delay circuit 11 is always the first preset value and keeps stable, so that the pulse width of the ECS pulse signal meets the requirements, and the normal execution of subsequent operations is ensured.

Figure 10:
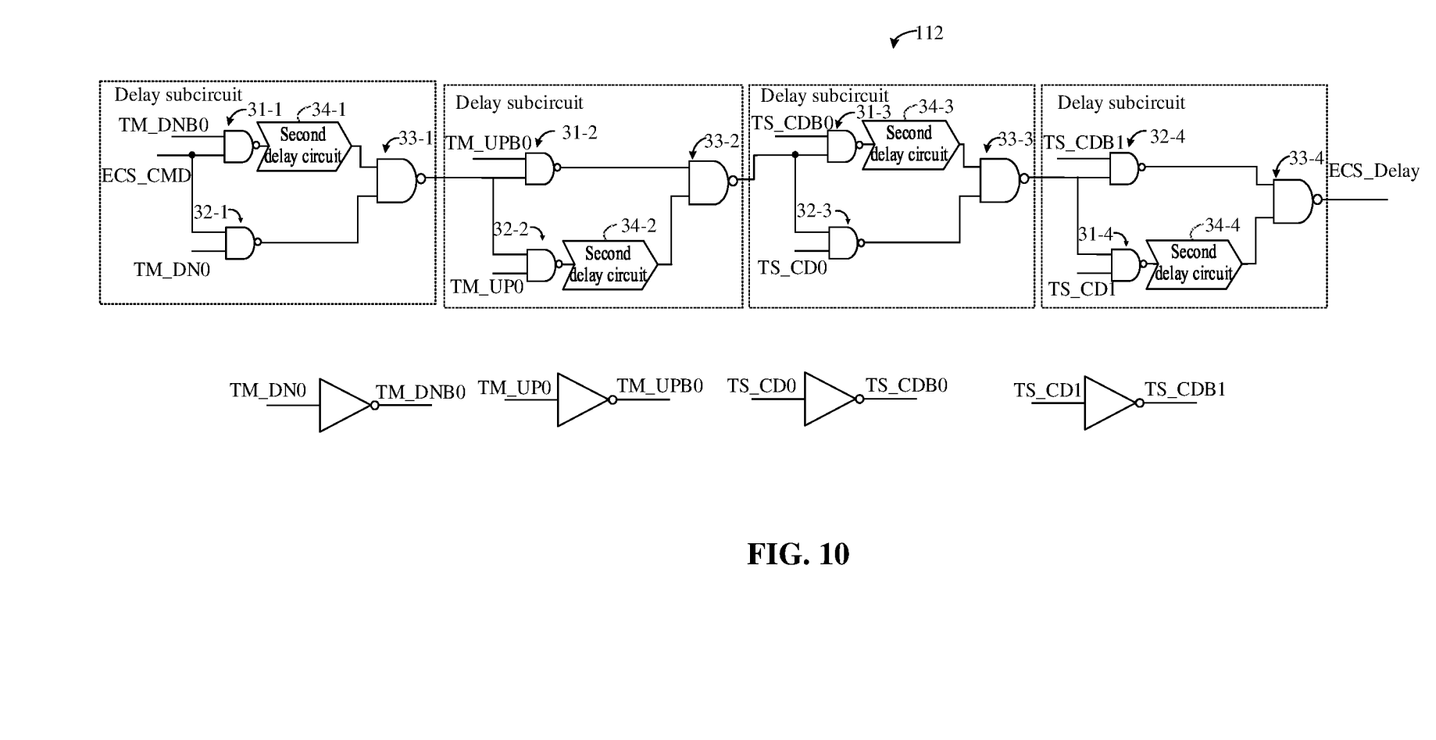
FIG. 10 is a schematic structural diagram of an adjustment circuit according to an embodiment of the disclosure.

In some embodiments, referring to FIG. 10, FIG. 10 is a schematic structural diagram of an adjustment circuit 112 according to an embodiment of the disclosure. As shown in FIG. 10, the adjustment circuit 112 includes N delay subcircuits (shown with N=4 as an example in FIG. 10) arranged in series, and an input end of the first delay subcircuit forms the input end of the adjustment circuit 112, an input end of the (i+1) th delay subcircuit is connected to an output end of the ith delay subcircuit, and an output end of the Nth delay subcircuit forms an output end of the adjustment circuit 112.

It is to be noted that, among the N adjustment sub-signals of the adjustable parameter, each adjustment sub-signal belongs to an up-regulation parameter (such as TM_UP0 and TS_CD1) or a down-regulation parameter (such as TM_DN0 and TS_CD0). Correspondingly, the adjustment circuit 112 is specifically configured to control, in the case where the ith adjustment sub-signal belongs to the up-regulation parameter, the ith delay subcircuit to perform delay transmission processing on an input signal when the ith adjustment sub-signal is in a first state, and control the ith delay subcircuit to perform direct transmission processing on the input signal when the ith adjustment sub-signal is in a second state; or, control, in the case where the ith adjustment sub-signal belongs to the down-regulation parameter, the ith delay sub circuit to perform direct transmission processing on the input signal when the ith adjustment sub-signal is in the first state, and control the ith delay subcircuit to perform delay transmission processing on the input signal when the ith adjustment sub-signal is in the second state. i is a positive integer and i is less than or equal to N.

The first state and the second state are different, and specific values thereof may be set according to actual application scenarios. For example, the first state may be represented as 1, and the second state may be represented as 0.

It is to be understood that in FIG. 10, the adjustment circuit 112 includes four delay subcircuits, and the adjustable parameter includes four adjustment sub-signals TM_UP0, TS_CD1, TM_DN0, and TS_CD0. Herein, TS_CD1 and TS_CD0 belong to the temperature sensor codes, and TM_UP0 and TM_DN0 belong to the test mode codes. Meanwhile, TM_UP0 and TS_CD1 belong to the up-regulation parameters, while TM_DN0 and TS_CD0 belong to the down-regulation parameters. In the actual application process, the specific numbers of delay subcircuits, adjustment sub-signals of the adjustable parameter, up-regulation parameters, down-regulation parameters, etc. may all be determined according to the requirements. The embodiments of the disclosure may be described below by only taking FIG. 10 as an example, but FIG. 10 does not constitute any quantity limitation.

Thus, the adjustment circuit 112 may change the working state of the delay subcircuit by setting the specific values of the up-regulation parameter and the down-regulation parameter, thus changing the delay generated by the adjustment circuit 112.

In some embodiments, each delay subcircuit includes a first path and a second path. A second delay circuit (for example, 34-1, 34-2, 34-3, 34-4 in FIG. 10) is arranged on the first path, and configured to enable the input signal to be delayed by a second preset value (for example, 0.1 ns, 0.05 ns). Herein, the second preset value is smaller than the first preset value. Correspondingly, the ith delay subcircuit is configured to receive the input signal, the ith adjustment sub-signal and an inverted signal of the ith adjustment sub-signal, and perform delay transmission processing on the input signal through the first path or perform direct transmission processing on the input signal through the second path based on the level state of the ith adjustment sub-signal.

It is to be understood that, since the second delay circuit is arranged on the first path, compared with the second path, the first path additionally generates a delay of the second preset value during signal transmission. Therefore, the signal transmission via the first path is called delay transmission processing, and the signal transmission via the second path is called direct transmission processing.

Each second delay circuit is configured to generate a delay of the second preset value, and the delays generated by different second delay circuits may be the same and may also be different. For example, all the second delay circuits generate a delay of 0.1 ns, or all the second delay circuits generate a delay of 0.05 ns. Or, some second delay circuits generate a delay of 0.1 ns, while some second delay circuits generate a delay of 0.05 ns. In the embodiments of the disclosure, description is made below by taking all the second delay circuits generating a delay of 0.1 ns as an example, but this does not constitute a relevant limitation.

It is also to be noted that, in the case where the adjustment sub-signal belongs to the up-regulation parameter (for example, TM_UP0/TS_CD1 in FIG. 10), if the adjustment sub-signal is in the first state, the corresponding delay sub circuit performs delay transmission processing on the input signal through the first path. If the adjustment sub-signal is in the second state, the corresponding delay sub circuit performs direct transmission processing on the input signal through the second path. On the contrary, in the case where the adjustment sub-signal belongs to the down-regulation parameter (for example, TM_DN0/TS_CD0 in FIG. 10), if the adjustment sub-signal is in the first state, the corresponding delay subcircuit performs direct transmission processing on the input signal through the second path. If the adjustment sub-signal is in the second state, the corresponding delay subcircuit performs delay transmission processing on the input signal through the first path.

In a specific embodiment, in the case where the ith adjustment sub-signal belongs to the up-regulation parameter (referring to the second and fourth delay subcircuits from the left in FIG. 10 for details), the ith delay sub circuit further includes a first NAND gate (such as 31-2 and 31-4 in FIG. 10), a second NAND gate (such as 32-2 and 32-4 in FIG. 10), and a third NAND gate (such as 33-2 and 33-4 in FIG. 10). A first input end of the first NAND gate is connected to the inverted signal of the ith adjustment sub-signal. A second input end of the first NAND gate receives the input signal of the ith delay sub circuit, an output end of the first NAND gate is connected to the first input end of the third NAND gate, and an output end of the third NAND gate outputs an output signal of the ith delay subcircuit to form the second path. A first input end of the second NAND gate is connected to the ith adjustment sub-signal, a second input end of the second NAND gate receives the input signal of the ith delay subcircuit, the output end of the second NAND gate is connected to the input end of the second delay circuit (such as 34-2 and 34-4 in FIG. 10), an output end of the second delay circuit is connected to the second input end of the third NAND gate, and the output end of the third NAND gate outputs the output signal of the ith delay subcircuit to form the first path.

Similarly, in the case where the ith adjustment sub-signal belongs to the down-regulation parameter (referring to the first and third delay subcircuits from the left in FIG. 10 for details), the ith delay subcircuit further includes a first NAND gate (such as 31-1 and 31-3 in FIG. 10), a second NAND gate (such as 32-1 and 32-3 in FIG. 10), and a third NAND gate (such as 33-1 and 33-3 in FIG. 10). A second input end of the first NAND gate receives the input signal of the ith delay sub circuit, an output end of the first NAND gate is connected to the input end of the second delay circuit (such as 34-1 and 34-3 in FIG. 10), the output end of the second delay circuit is connected to the second input end of the third NAND gate, and the output end of the third NAND gate outputs the output signal of the ith delay subcircuit to form the first path. A first input end of the second NAND gate is connected to the ith adjustment sub-signal, a second input end of the second NAND gate receives the input signal of the ith delay sub circuit, an output end of the second NAND gate is connected to the first input end of the third NAND gate, and the output end of the third NAND gate outputs the output signal of the ith delay sub circuit to form the second path.

In addition, as shown in FIG. 10, the adjustment circuit 112 further includes N third inverters (output with N=4 as an example in FIG. 10), a receiving end of the ith third inverter receives the ith adjustment sub-signal (TM_DN0, TM_UP0, TS_CD0 or TS_CD1), and an output end of the ith third inverter outputs the inverted signal (TM_DNB0, TM_UPB0, TS_CDB0 or TS_CDB1) of the ith adjustment sub-signal.

As described in the aforementioned example scenario, the initial values of TM_DN0, TM_UP0, TS_CD0 and TS_CD1 may all be set to 0, and the adjustment circuit 112 generates a total delay of 0.2 ns. Thus, in the test mode, the delay value of the adjustment circuit 112 may be decreased by 0.1 ns by setting TS_CD0 to 1, or the delay value of the adjustment circuit 112 may be increased by 0.1 ns by setting TS_CD1 to 1. In addition, for the memory, the delay value of the delay circuit 11 is related to the working temperature, so the delay can be increased or decreased for compensation by decoding a temperature signal measured by a temperature sensor and executing corresponding logic processing. Specifically, by setting TM_DN0 to 1 through temperature sensor decoding, the delay value of the delay circuit 11 may be decreased by 0.1 ns. Also, by setting TM_UP1 to 1, the delay value of the delay circuit 11 may be increased by 0.1 ns. It is to be seen from the above that the working parameter (the working parameter indicates that there are a plurality of delay sub-circuits in the adjustment circuit 112 to perform delay transmission processing on the input signal) of the delay circuit 11 in the pulse generator 10 is adjustable, which can not only compensate the delay change caused by various factors, but also adjust the first preset value to further ensure the stability of the pulse width of the ECS pulse signal.

In the automatic ECS operation mode, it is necessary to steal a refresh instruction or a self-refresh instruction to generate the ECS command signal. In the manual ECS operation mode, the ECS command signal needs to be generated by the multi-purpose command MPC. The ECS command signal indicates that ECS is performed on the memory, and the subsequent operations such as activation, read/write and precharge need to be executed, so the pulse needs to be stable after the ECS command signal is generated. Particularly, the pulse width of the ECS command signal generated by the multi-purpose command MPC may be one tCK or a plurality of tCK. The embodiment of the disclosure provides a pulse generator 10. On the one hand, for all ECS command signals with different pulse widths, an ECS pulse signal with a stable pulse width can be generated, without being affected by external working frequency, so as to ensure that the waveform of the ECS pulse signal always meets the requirements, and further ensure the smooth execution of subsequent operations such as activation, read/write and precharge. On the other hand, the working parameter of the delay circuit in the pulse generator 10 is adjustable, which may not only compensate the delay change caused by various factors, but also adjust the first preset value to further ensure the stability of the pulse width of the ECS pulse signal.

Figure 11:
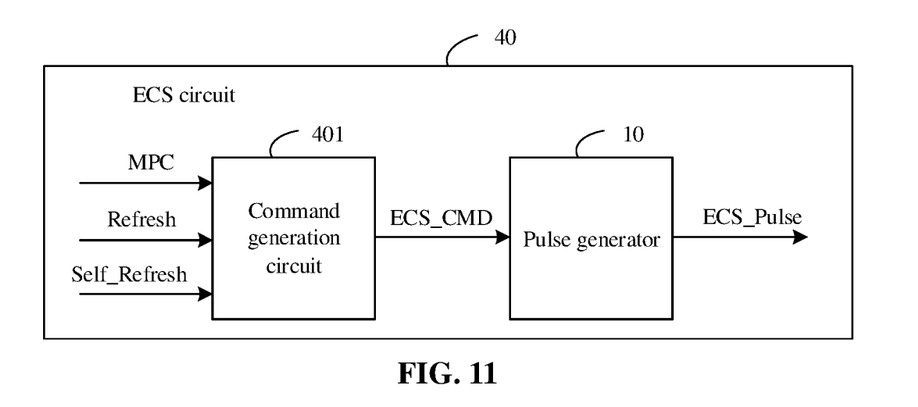
FIG. 11 is a schematic structural diagram of an ECS circuit according to an embodiment of the disclosure.

In another embodiment of the disclosure, referring to FIG. 11, FIG. 11 illustrates a schematic structural diagram of an ECS circuit 40 according to an embodiment of the disclosure. As shown in FIG. 11, the ECS circuit 40 includes a command generation circuit 401 and the aforementioned pulse generator 10.

The command generation circuit is configured to receive an external multi-purpose command in a first operating mode, and output an ECS command signal based on the multi-purpose command MPC. The pulse width of the ECS command signal is associated with the pulse width of the multi-purpose command MPC, and the pulse width of the multi-purpose command MPC is provided with a plurality of values.

The pulse generator is configured to output an ECS pulse signal based on the ECS command signal. The pulse width of the ECS pulse signal is a first preset value.

It is to be noted that reference is made to the aforementioned description for the structure of the pulse generator 10. Here, since the pulse width of the multi-purpose command has a plurality of values, and the pulse width of the multi-purpose command determines the pulse width of the ECS command signal (reference is made to the aforementioned description for details), the pulse width of the ECS command signal has a plurality of values. For the pulse generator 10, delay processing is performed on the ECS command signal to generate the delay command signal, and the delay between the ECS command signal and the delay command signal is the first preset value. Then, the ECS command signal and the delay command signal are jointly used to generate the ECS pulse signal. Further, since the pulse width of the ECS pulse signal depends on the delay between the ECS command signal and the delay command signal, the pulse width of the ECS pulse signal is also the first preset value. Thus, the pulse generator 10 can generate an ECS pulse signal with a stable pulse width, without being affected by the external working frequency, thereby ensuring that the waveform of the ECS pulse signal always meets the requirements, and further ensuring the smooth execution of subsequent operations such as activation, read/write and precharge.

In some embodiments, the command generation circuit is configured to output the ECS command signal based on a refresh instruction Refresh or a self-refresh instruction Self-Refresh in a second operating mode. Here, the first operating mode is a manual ECS operation mode, and the second operating mode is an automatic ECS operation mode.

The embodiment of the disclosure provides an ECS circuit 40, which includes a pulse generator 10 shown in FIG. 4 and FIGS. 6-10. On the one hand, for all ECS command signals with different pulse widths, the pulse generator 10 can generate an ECS pulse signal with a stable pulse widths, without being affected by external working frequency, so as to ensure that the waveform of the ECS pulse signals always meets the requirements, and further ensure the smooth execution of subsequent operations such as activation, read/write and precharge. On the other hand, the working parameter of the delay circuit in the pulse generator 10 is adjustable, which may not only compensate the delay change caused by various factors, but also adjust the first preset value to further ensure the stability of the pulse width of the ECS pulse signal.

Figure 12:
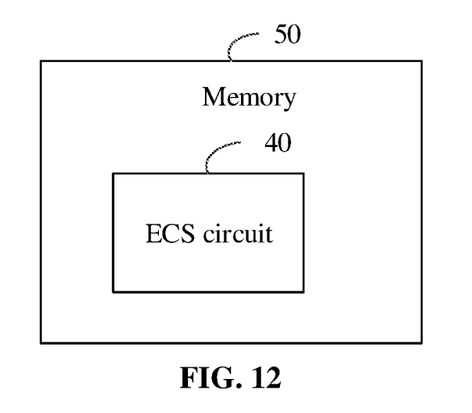
FIG. 12 is a composition structure diagram of a memory according to an embodiment of the disclosure.

In another embodiment of the disclosure, referring to FIG. 12, FIG. 12 is a composition structure diagram of a memory 50 according to an embodiment of the disclosure. As shown in FIG. 12, the memory 50 at least includes the aforementioned ECS circuit 40.

Further, in some embodiments, the memory meets the DDR5 specification.

Thus, the memory in the embodiment of the disclosure generates an ECS pulse signal by the pulse generator 10 shown in FIG. 4 and FIGS. 6-10. On the one hand, for all ECS command signals with different pulse widths, the pulse generator 10 can generate an ECS pulse signal with a stable pulse widths, without being affected by external working frequency, so as to ensure that the waveform of the ECS pulse signals always meets the requirements, and further ensure the smooth execution of subsequent operations such as activation, read/write and precharge. On the other hand, the working parameter of the delay circuit in the pulse generator 10 is adjustable, which may not only compensate the delay change caused by various factors, but also adjust the first preset value to further ensure the stability of the pulse width of the ECS pulse signal.

The foregoing descriptions are only preferred embodiments of the disclosure and are not intended to limit the scope of protection of the disclosure. It is to be noted that terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Without further restrictions, the element defined by the statement "including a . . . " does not exclude the existence of another same element in the process, method, article or device including the element. The sequence numbers of the embodiments of the disclosure are adopted not to represent superiority-inferiority of the embodiments but only for description. The methods disclosed in several method embodiments provided in the present disclosure may be arbitrarily combined without conflict to obtain a new method embodiment. The characteristics disclosed in several product embodiments provided in the present disclosure may be arbitrarily combined without conflict to obtain a new product embodiment. The characteristics disclosed in the several method or device embodiments provided in the present disclosure may be arbitrarily combined without conflict to obtain a new method embodiment or device embodiment. The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the present disclosure shall be subject to the scope of protection of the claims.

The embodiments of the disclosure provide a pulse generator, an ECS circuit and a memory. The pulse generator includes a delay circuit and a latch circuit. The delay circuit is configured to receive an ECS command signal, perform delay processing on the ECS command signal, and output a delay command signal. The delay between the ECS command signal and the delay command signal is a first preset value. The latch circuit is configured to receive the ECS command signal and the delay command signal, perform latch processing based on the ECS command signal and the delay command signal, and output an ECS pulse signal. The pulse width of the ECS command signal has a plurality of values, and the pulse width of the ECS pulse signal is the first preset value. Thus, the pulse width of the ECS pulse signal depends on the delay value between the ECS command signal and the delay command signal. That is, the pulse width of the ECS pulse signal is only determined by delay processing on the ECS command signal by the delay circuit, and is not affected by the pulse width of the ECS command signal. Therefore, the pulse generator can generate the ECS pulse signal with a stable pulse width, avoid errors in the ECS mode, and finally improve the performance of the memory.

The invention claimed is:

1. A pulse generator, comprising:
a delay circuit, configured to receive an Error Check and Scrub (ECS) command signal, perform delay processing on the ECS command signal, and output a delay command signal, a delay between the ECS command signal and the delay command signal being a first preset value; and
a latch circuit, configured to receive the ECS command signal and the delay command signal, perform latch processing based on the ECS command signal and the delay command signal, and output an ECS pulse signal;
wherein a pulse width of the ECS command signal is provided with a plurality of values, and a pulse width of the ECS pulse signal is the first preset value;
wherein the latch circuit comprises a first NOR gate and a second NOR gate;
wherein a first input end of the first NOR gate receives the ECS command signal, a second input end of the first NOR gate is connected to an output end of the second NOR gate, a first input end of the second NOR gate is connected to an output end of the first NOR gate, a second input end of the second NOR gate receives the delay command signal, and a third input end of the second NOR gate receives the reset signal; and
the output end of the second NOR gate is configured to output the ECS pulse signal.

2. The pulse generator of claim 1, wherein initial values of the ECS command signal and the ECS pulse signal are both first level values, wherein the latch circuit is configured to control the ECS pulse signal to change from the first level value to a second level value when the ECS command signal changes from the first level value to the second level value, and control the ECS pulse signal to change from the second level value to the first level value when the delay command signal changes from the first level value to the second level value.

3. The pulse generator of claim 2, wherein the latch circuit is further configured to receive a reset signal, and control an initial state of the ECS pulse signal to be the first level value based on the reset signal.

4. The pulse generator of claim 1, wherein the latch circuit further comprises a first inverter and a second inverter, wherein an input end of the first inverter is connected to the output end of the second NOR gate, an input end of the second inverter is connected to an output end of the first inverter; and an output end of the second inverter being configured to output the ECS pulse signal.

5. The pulse generator of claim 2, wherein the delay circuit comprises a first delay circuit and an adjustment circuit, wherein the first delay circuit is configured to receive the ECS command signal and output an intermediate delay signal, a delay value between the ECS command signal and the intermediate delay signal being smaller than the first preset value; and the adjustment circuit is configured to receive an adjustable parameter and the intermediate delay signal, perform delay processing on the intermediate delay signal based on the adjustable parameter, and output the delay command signal.

6. The pulse generator of claim 2, wherein the delay circuit comprises an adjustment circuit, configured to receive an adjustable parameter, perform delay processing on the ECS command signal based on the adjustable parameter, and output the delay command signal.

7. The pulse generator of claim 5, wherein the adjustable parameter comprises N adjustment sub-signals, the adjustment circuit comprises N delay subcircuits arranged in series, an input end of the first delay subcircuit forms an input end of the adjustment circuit, an input end of the (i+1)th delay subcircuit is connected to an output end of the ith delay subcircuit, and an output end of the Nth delay subcircuit forms an output end of the adjustment circuit; and wherein the adjustment circuit is configured to: control, in a case where the ith adjustment sub-signal belongs to an up-regulation parameter, the ith delay subcircuit to perform delay transmission processing on an input signal when the ith adjustment sub-signal is in a first state, and control the ith delay subcircuit to perform direct transmission processing on the input signal when the ith adjustment sub-signal is in a second state; or control, in a case where the ith adjustment sub-signal belongs to a down-regulation parameter, the ith delay subcircuit to perform direct transmission processing on the input signal when the ith adjustment sub-signal is in the first state, and control the ith delay subcircuit to perform delay transmission processing on the input signal when the ith adjustment sub-signal is in the second state;

wherein both i and N are positive integers, i being less than or equal to N.

8. The pulse generator of claim 7, wherein each of the delay subcircuits comprises a first path and a second path, and a second delay circuit is arranged on the first path and configured to delay the input signal by a second preset value, the second preset value being smaller than the first preset value; and wherein the ith delay subcircuit is configured to receive the input signal, the ith adjustment sub-signal and an inverted signal of the ith adjustment sub-signal, and perform delay transmission processing on the input signal through the first path or perform direct transmission processing on the input signal through the second path based on a level state of the ith adjustment sub-signal.

9. The pulse generator of claim 8, wherein in the case where the ith adjustment sub-signal belongs to the up-regulation parameter, the ith delay subcircuit further comprises a first NAND gate, a second NAND gate and a third NAND gate, wherein a first input end of the first NAND gate is connected to the inverted signal of the ith adjustment sub-signal, a second input end of the first NAND gate receives the input signal of the ith delay subcircuit, an output end of the first NAND gate is connected to an input end of the third NAND gate, and an output end of the third NAND gate outputs an output signal of the ith delay subcircuit to form the second path; and a first input end of the second NAND gate is connected to the ith adjustment sub-signal, a second input end of the second NAND gate receives the input signal of the ith delay subcircuit, an output end of the second NAND gate is connected to an input end of the second delay circuit, an output end of the second delay circuit is connected to a second input end of the third NAND gate, and the output end of the third NAND gate outputs the output signal of the ith delay subcircuit to form the first path.

10. The pulse generator of claim 8, wherein in the case where the ith adjustment sub-signal belongs to the down-regulation parameter, the ith delay subcircuit further comprises a first NAND gate, a second NAND gate and a third NAND gate, wherein a first input end of the first NAND gate is connected to the inverted signal of the ith adjustment sub-signal, a second input end of the first NAND gate receives the input signal of the ith delay subcircuit, an output end of the first NAND gate is connected to an input end of the second delay circuit, an output end of the second delay circuit is connected to a second input end of the third NAND gate, and an output end of the third NAND gate outputs the output signal of the ith delay subcircuit to form the first path;

a first input end of the second NAND gate is connected to the ith adjustment sub-signal, a second input end of the second NAND gate receives the input signal of the ith delay subcircuit, an output end of the second NAND gate is connected to a first input end of the third NAND gate, and the output end of the third NAND gate outputs the output signal of the ith delay subcircuit to form the second path.

11. The pulse generator of claim 7, wherein the pulse generator is applied to a memory; and wherein the N adjustment sub-signals are set via an external command in a test mode of the memory; or, the N adjustment sub-signals are determined based on temperature decoding of the memory; or, part of the N adjustment sub-signals is set via an external command in the test mode of the memory, and the rest of the N adjustment sub-signals is determined based on the temperature decoding of the memory.

12. An Error Check and Scrub (ECS) circuit, comprising:
a command generation circuit, configured to receive an external multi-purpose command in a first operating mode, and output an ECS command signal based on the multi-purpose command, a pulse width of the ECS command signal being associated with a pulse width of the multi-purpose command, and the pulse width of the multi-purpose command being provided with a plurality of values; and
a pulse generator, comprising:
a delay circuit, configured to receive the ECS command signal, perform delay processing on the ECS command signal, and output a delay command signal, a delay between the ECS command signal and the delay command signal being a first preset value; and
a latch circuit, configured to receive the ECS command signal and the delay command signal, perform latch processing based on the ECS command signal and the delay command signal, and output an ECS pulse signal, a pulse width of the ECS pulse signal being the first preset value;
wherein the latch circuit comprises a first NOR gate and a second NOR gate;
wherein a first input end of the first NOR gate receives the ECS command signal, a second input end of the first NOR gate is connected to an output end of the second NOR gate, a first input end of the second NOR gate is connected to an output end of the first NOR gate, a second input end of the second NOR gate receives the delay command signal, and a third input end of the second NOR gate receives the reset signal; and
the output end of the second NOR gate is configured to output the ECS pulse signal.

13. The ECS circuit of claim 12, wherein the command generation circuit is configured to output the ECS command signal based on a refresh instruction or a self-refresh instruction in a second operating mode.

14. A memory, comprising the ECS circuit of claim 12.

* * * * *